US010200046B1

(12) United States Patent
Leong et al.

(10) Patent No.: US 10,200,046 B1
(45) Date of Patent: Feb. 5, 2019

(54) HIGH RESOLUTION AND LOW POWER INTERPOLATOR FOR DELAY CHAIN

(71) Applicant: Intel Corporation, Santa Clara, CA (US)

(72) Inventors: Chee Seng Leong, Bayan Lepas (MY); Tat Hin Tan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/433,853

(22) Filed: Feb. 15, 2017

(51) Int. Cl.
*H03L 7/06* (2006.01)
*H03L 7/081* (2006.01)
*H03K 5/135* (2006.01)
*H03K 5/06* (2006.01)
*H03K 5/00* (2006.01)

(52) U.S. Cl.
CPC ............ *H03L 7/0818* (2013.01); *H03K 5/06* (2013.01); *H03K 5/135* (2013.01); *H03K 2005/00052* (2013.01)

(58) Field of Classification Search
None
See application file for complete search history.

(56) References Cited

U.S. PATENT DOCUMENTS

| | | | | |
|---|---|---|---|---|
| 6,867,627 B1* | 3/2005 | Murtagh | ............... | H03L 7/0812 327/149 |
| 7,123,063 B2* | 10/2006 | Lutkemeyer | .......... | H03L 7/0812 327/149 |
| 2003/0042952 A1* | 3/2003 | Gomm | ..................... | G11C 7/22 327/158 |
| 2005/0110671 A1* | 5/2005 | Lee | ........................ | H03L 7/0805 341/162 |
| 2009/0174441 A1* | 7/2009 | Gebara | ................. | H02M 3/073 327/115 |
| 2013/0271194 A1* | 10/2013 | Pellerano | ................ | H03L 7/148 327/159 |
| 2016/0359476 A1* | 12/2016 | Yu | ............................ | H03K 5/19 |

OTHER PUBLICATIONS

Jorgen Christiansen, Moritz Horstmann, Lukas Perktold, Jeffrey Prinzie,; "New PS TDC for HEP and Other Applications"; 2013.

* cited by examiner

*Primary Examiner* — Lincoln Donovan
*Assistant Examiner* — Khareem E Almo
(74) *Attorney, Agent, or Firm* — Fletcher Yoder, P.C.

(57) ABSTRACT

A delay-locked loop includes multiple inverters coupled together, wherein the inverters receive an input clock signal and output a first clock signal and a second clock signal. The input clock signal passes through a first set of inverters having a first number of inverters to generate the first clock signal. The input clock signal also passes through a second set of inverters having a second number of inverters one inverter greater than the first number of inverters to generate the second clock signal. The delay-locked loop also includes a polarity matching block that receives the first clock signal and the second clock signal and changes polarity of one of the first clock signal and the second clock signal.

18 Claims, 11 Drawing Sheets

US 10,200,046 B1

HIGH RESOLUTION AND LOW POWER INTERPOLATOR FOR DELAY CHAIN

BACKGROUND

The present disclosure relates generally to a delay locked chain. More particularly, the present disclosure relates to a high resolution and/or low power delay chain.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In electronics, a signal is used to convey information. A delay chain is a digital circuit that may be used to change a phase (a position of a point of time) of the signal. The delay chain may be implemented as a closed loop, such as in the case of a delay-locked loop. The signal may be a clock signal that includes a periodic waveform that may be used to coordinate actions of digital circuits. The clock signal oscillates between a high state and a low state. Digital circuits using the clock signal may become active at a rising edge and/or a falling edge of the clock cycle. The delay chain may be used to position or delay a signal. For example, the delay chain may position or delay the signal relative to an incoming signal. In particular, the delay-locked loop may match phases between an input clock signal and a feedback clock signal by delaying the input clock signal such that the delayed input clock signal is in phase with the feedback clock signal. The delay that is added to the input clock signal by the delay-locked loop may include two components: a coarse delay component and a fine delay component.

The coarse delay component may be generated by selecting one or more delay cells among a chain of complementary metal-oxide-semiconductor (CMOS) inverters (or buffers). Each delay cell may include a first CMOS inverter that buffers and inverts the polarity of the input clock signal (such that the inverted input clock signal is 180 degrees out of phase with the original input clock signal), and an immediately adjacent second CMOS inverter further buffers and re-inverts the input clock signal (such that the re-inverted input clock signal is in phase with the original input clock signal). As such, the smallest incremental delay (e.g., phase or delay resolution) achievable by the coarse delay component is that generated by two back-to-back inverters. Because the CMOS inverter delay in deep sub-micron process (e.g., less than 0.1 micrometer or micron) may typically be less than 50 picoseconds (ps), the minimum phase resolution of the coarse delay component may be about 100 ps.

By contrast, the fine delay component may be generated by selecting one or more interpolator cells of a phase interpolator, such as a digital interpolator. The interpolator interpolates between two incoming signals (e.g., from a first delay cell and an immediately adjacent second delay cell associated with the coarse delay component). The fine delay component is a delay amount less than the minimum phase resolution of the coarse delay component and is added to the coarse delay component to achieve greater phase resolution than can be achieved by the coarse delay component alone. The resolution of the fine delay component is dependent on the number of bits of the interpolator. In particular, the resolution of the fine delay component doubles for each added bit of the interpolator. However, adding a bit to the interpolator approximately doubles both the size of and the power consumed by the delay-locked loop.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to a delay chain. More particularly, the present disclosure relates to a high resolution and low power delay chain. The delay chain generates a delay that includes a phase resolution of a single inverter (prior to interpolation). The delay chain also includes a polarity matching component to compensate for polarity reversal of a signal passing through the single inverter. The phase resolution of the single inverter enables decreasing the resolution of a phase interpolator of the delay chain by one bit, while retaining overall phase resolution of the delay chain. Thus, the size of and the power consumed by the delay chain may be halved while retaining phase resolution.

In one embodiment, a delay-locked loop includes multiple inverters coupled together, wherein the inverters receive an input clock signal and output a first clock signal and a second clock signal. The input clock signal passes through a first set of inverters having a first number of inverters to generate the first clock signal. The input clock signal also passes through a second set of inverters having a second number of inverters one inverter greater than the first number of inverters to generate the second clock signal. The delay-locked loop also includes a polarity matching block that receives the first clock signal and the second clock signal and changes polarity of one of the first clock signal and the second clock signal.

In another embodiment, an integrated circuit including a delay chain that delays an input clock signal. The delay chain includes multiple inverters coupled together that receive the input clock signal and output a first clock signal and a second clock signal. The input clock signal passes through a first set of inverters having a first number of inverters to generate the first clock signal. The input clock signal also passes through a second set of inverters having a second number of inverters one inverter greater than the first number of inverters to generate the second clock signal. The delay chain also includes a polarity matching block that receives the first clock signal and the second clock signal and changes polarity of one of the first clock signal and the second clock signal. The integrated circuit also includes a controller communicatively coupled to the delay chain that receives the input clock signal and a feedback clock signal from a clock distribution network. The controller also instructs the delay chain to delay the input clock signal such that a first phase of the input clock signal approximately matches a second phase of the feedback clock signal.

In yet another embodiment, a method for delay an input clock signal includes receiving the input clock signal. The method also includes instructing a delay chain to send the input clock signal through a first set of inverters of the delay chain having a first number of inverters to generate a first clock signal. The method further includes instructing the delay chain to send the input clock signal through a second set of inverters of the delay chain having a second number of inverters one inverter greater than the first number of inverters to generate a second clock signal. The method also includes instructing a polarity matching block to change polarity of the first clock signal or the second clock signal. The method further includes instructing a phase interpolator to interpolate between the first clock signal and the second clock signal.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A circuit may use a delay chain to position or delay a signal, such as a clock signal. For example, the delay chain may position or delay the signal relative to an incoming signal. In some embodiments, the delay chain may match phases between an input clock signal and a clock distribution network. The delay chain may be implemented as a closed loop, such as in the case of a delay-locked loop.

Figure 1:
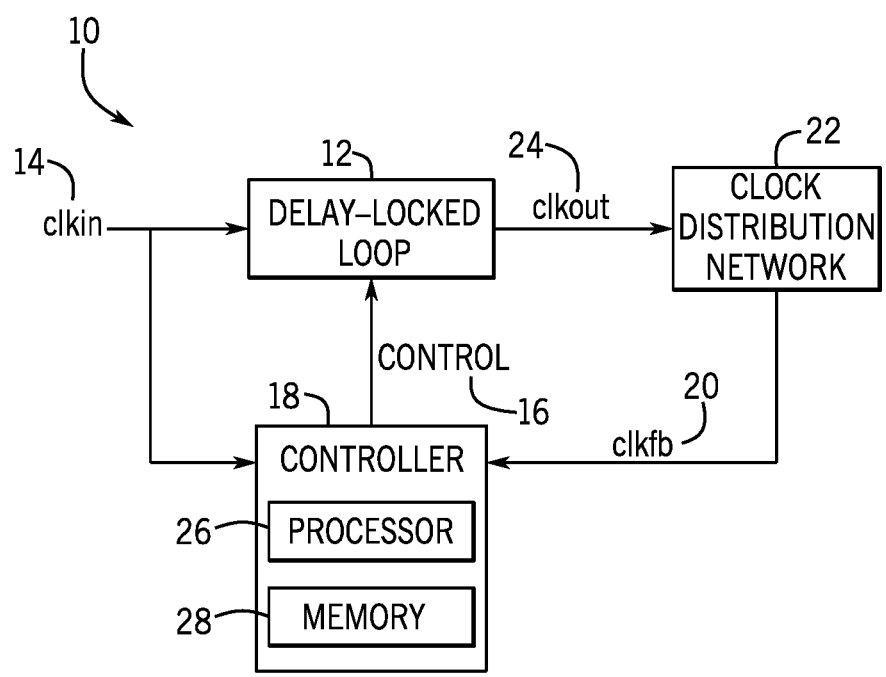
FIG. 1 is a block diagram of a circuit using a delay-locked loop to position or delay an incoming clock signal relative to a clock distribution network, in accordance with an embodiment of the present disclosure.

For example, FIG. 1 is a block diagram of an integrated circuit 10 that uses a delay-locked loop 12 to position or delay an input clock signal (clkin) 14 relative to a clock distribution network 15, in accordance with an embodiment of the present disclosure. The delay-locked loop 12 receives the input clock signal (clkin) 14 and a control signal (control) 16. The control signal 16 may be generated by a controller 18 communicatively coupled to the delay-locked loop 12. The controller 18 also receives the input clock signal 14, as well as a feedback clock signal 20 from the clock distribution network 15. The controller 18 may compare the input clock signal 14 to the feedback clock signal 20 and control the delay-locked loop 12 via the control signal 16 to delay the input clock signal 14 until an edge (e.g., a rising edge) of the input clock signal 14 aligns with an edge (e.g., a rising edge) of the feedback clock signal 20. The controller 18 may then instruct the delay-locked loop to "lock," since the input clock signal 14 and the feedback clock signal 20 are in phase. The delay-locked loop 12 may output the locked signal as an output clock signal (clkout) 24 to the clock distribution network 15 because the output clock signal 24 is in phase with the clock distribution network 15. The clock distribution network 15 may distribute the output clock signal 24 to other components of the integrated circuit. While the present disclosure discusses the delay chain in the form of a delay-locked loop, it should be understood that any suitable delay chain is also contemplated. Additionally, while the present disclosure discusses the signal in the form of a clock signal, it should be understood that any suitable signal that conveys information is contemplated.

The controller 18 may include any suitable control logic that compares the input clock signal 14 to the feedback clock signal 20 and instructs the delay-locked loop 12 to delay the input clock signal 14 such that the phase of the input clock signal 14 matches the phase of the feedback clock signal 20. For example, the controller 18 may include or be part of one or more processors 26 (e.g., microprocessors or any other suitable integrated circuits) that may execute software programs to control the delay-locked loop 12. Moreover, the processor(s) 26 may include multiple microprocessors, one or more other integrated circuits (e.g., application specific integrated circuits (ASICs), field programmable gate arrays (FPGAs), reduced instruction set (RISC) processors, and the like), or some combination thereof. The controller 18 may couple to one or more memory devices 28 that may store information such as control software look up tables, configuration data, etc. In some embodiments, the processor(s) 26 and/or the memory device(s) 28 may be external to the controller 18. The memory device(s) 28 may include a tangible, non-transitory, machine-readable-medium, such as a volatile memory (e.g., a random access memory (RAM)) and/or a nonvolatile memory (e.g., a read-only memory (ROM)). The memory device(s) 28 may store a variety of information and be used for various purposes. For example, the memory device(s) 28 may store machine-readable and/or processor-executable instructions (e.g., firmware or software) for the processor(s) 26 to execute, such as instructions to control the delay-locked loop 12. The memory device(s) 28 may include one or more storage devices (e.g., nonvolatile storage devices) that may include read-only memory (ROM), flash memory, a hard drive, or any other suitable optical, magnetic, or solid-state storage medium, or any combination thereof. While the present disclosure discusses a control element in the form of the controller 18 having the processor(s) 26 and the memory device(s) 28, it should be understood that any suitable control element is also contemplated, such as an analog biasing circuit or finite state machine.

Figure 2:
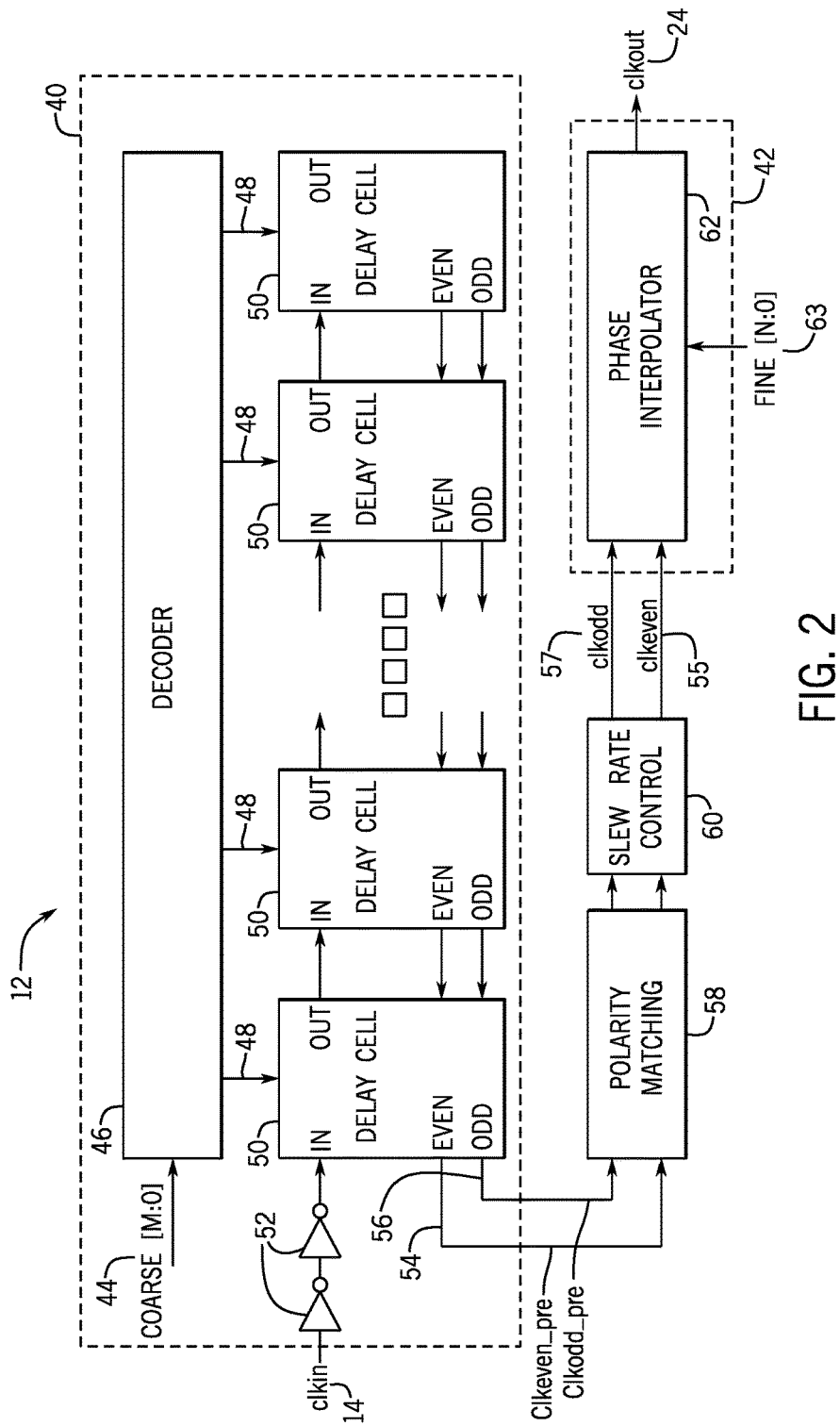
FIG. 2 is a high-level schematic diagram of the delay-locked loop of FIG. 1, in accordance with an embodiment of the present disclosure.

FIG. 2 is a high-level schematic diagram of the delay-locked loop 12 of FIG. 1, in accordance with an embodiment of the present disclosure. As discussed above, the delay-locked loop 12 delays the input clock signal 14 such that the delayed input clock signal or output clock signal 24 and the feedback clock signal 20 are 360 degrees out of phase, and thus are in phase. When edges from the delayed input signal line up with edges from the feedback clock signal 20, the delay-locked loop is "locked."

The delay that is added to the input clock signal 14 by the delay-locked loop 12 may include two components: a coarse delay component and a fine delay component. The delay-locked loop 12 may include a coarse delay block 40 that generates the coarse delay component and a fine delay block 42 that generates the fine delay component.

The coarse delay block 40 receives the input clock signal 14 and a coarse delay control signal 44 from the controller 18 via the control signal 16. The coarse delay block 40 includes a decoder 46 that decodes the coarse delay control signal 44 into a set of delay cell control signals 48 that are sent to a set of delay cells 50. As illustrated, each delay cell control signal of the set of delay cell control signals 48 corresponds to a delay cell 40 of the set of delay cells 50. The controller 18 and the coarse delay block 40 (and the decoder 46) may use any suitable encoding/decoding scheme to encode/decode the coarse delay signal 44, such as Gray coding.

The number of bits (e.g., M) of the coarse delay control signal 44 corresponds to the number of delay cell control signals 48 and the number of delay cells 50 in the coarse delay block 40. The number of bits may include any suitable number for providing the coarse delay component, such as between 1 and 1024 bits. The controller 18 may select an amount of coarse delay using the delay cell control signals 48 to control the delay cells 50.

Each delay cell 50 may include one or more buffer components, such as CMOS inverters and/or CMOS tri-state inverters. The CMOS inverters may be biased, digital, current-starved, or the like. In some embodiments, the one or more buffer components may be any suitable devices that may buffer a clock signal, such as any suitable type of inverter. Each delay cell 50 receives as input the input clock signal 14. As illustrated, the input clock signal 14 may first pass through a set of inverters (e.g., CMOS inverters) 52 before reaching a first delay cell 50. The set of inverters 52 may clarify or condition a slope of the input clock signal 14 to ensure a more accurate or linear slope is input to the set of delay cells 50. In some embodiments, the set of inverters 52 may not be included or bypassed. In alternative or additional embodiments, other suitable components may be used instead of the set of inverters 52 to condition the slope of the input clock signal 14. In one embodiment, the input clock signal 14 is input directly to the first delay cell 50.

Each delay cell 50 outputs two clock signals, an even clock signal (clkeven_pre) 54 and an odd clock signal (clkodd_pre) 56. Of these, one of the even clock signal 54 and the odd clock signal 56 passes through an additional inverter (e.g., CMOS inverter) in the delay cell 50. As such, one of the even clock signal 54 and the odd clock signal 56 is 180 degrees out of phase with the other (e.g., of opposite polarity) and is delayed by one inverter. For example, the odd clock signal 56 may pass through the additional inverter, such that the odd clock signal 56 is 180 degrees out of phase with the even clock signal 54 and is delayed by one inverter.

Both the even clock signal 54 (clkeven_pre) and the odd clock signal 56 (clkodd_pre) are input to a polarity matching block 58. The polarity matching block 58 may include at least one inverter (e.g., CMOS inverter) and a component (e.g., a transmission gate) that mimics delay of the at least one inverter. The polarity matching block 58 may invert one of the even clock signal 54 and the odd clock signal 56 using the at least one inverter, such that a resulting even clock signal 55 and a resulting odd clock signal 57 are output to have the same polarity, but the delay of one inverter still remains between the even clock signal 55 and the odd clock signal 57. In some embodiments, the polarity matching block 58 may include inverters connected in series rather than the at least one inverter, and inverters connected in series with the component that mimics delay of the at least one inverter. The component that mimics delay of the at least one inverter may be any suitable component that may delay the even clock signal 54 or the odd clock signal 56, such as a transmission gate.

The outputs of the polarity matching block 58 are input to a slew rate control block 60. The slew rate control block 60 may include a slew rate control circuit for each of the output signals (the polarity-matched even clock signal 55 and odd clock signal 57) from the polarity matching block 58. The slew rate control circuits may slow down edges of the output signals of the polarity matching block 58 for better interpolation accuracy.

The outputs of the slew rate control block 60 (clkodd and clkeven) are input to the fine delay block 42, and more specifically, to a phase interpolator 62 of the fine delay block 42. The phase interpolator 62 also receives a fine delay control signal 63. The phase interpolator 62 includes a set of interpolator cells that each includes inverters (e.g., CMOS inverters).

Figure 3:
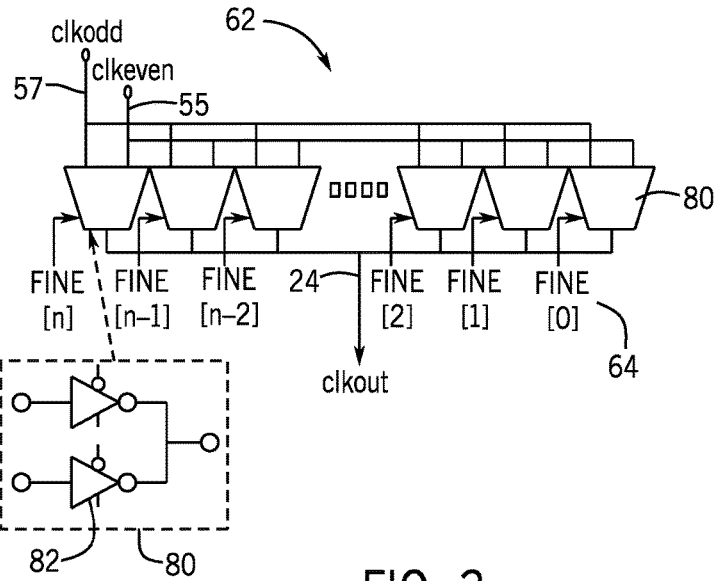
FIG. 3 is a schematic diagram of a phase interpolator of the delay-locked loop of FIG. 1 using interpolator cells connected in parallel, in accordance with an embodiment of the present disclosure.

In some embodiments, the set of interpolator cells are connected in parallel. For example, FIG. 3 is a schematic diagram of the phase interpolator 62 using interpolator cells 80 connected in parallel, in accordance with an embodiment of the present disclosure. Each interpolator cell 80 receives as inputs the even clock signal 55, the odd clock signal 57, and the interpolator cell control signal 64 that may be a bit of the fine delay control signal 63. The fine delay block 42 (and the phase interpolator 62) may use any suitable encoding/decoding scheme, such as thermometer coding. The controller 18 may select an amount of fine delay using the interpolator cell control signals 64 to control the interpolator cells 80.

As illustrated, each interpolator cell 80 includes two CMOS inverters (e.g., tri-stated inverters) 82 that generate a middle phase between the even clock signal 55 and the odd clock signal 57. The number of bits (e.g., N) of the fine delay control signal 63 corresponds to the set of interpolator cells 80 in the fine delay block 42. Specifically, the number of interpolator cells 80 for N-bit phase resolution is $2^N$. The number of bits may include any suitable number for providing the fine delay component, such as between 1 and 1024 bits. When using the delay-locked loop 12 in an application that continuously adjusts phase (e.g., to track voltage and/or temperature drift while a communication link is transmitting or receiving data), less phase resolution results in more jitter to the timing budget of the communication link. As such, adding phase interpolation bits improves the application by reducing jitter (e.g., for a gigabit-link). However, adding a bit to the phase interpolator 62 using interpolator cells 80 connected in parallel results in slower clock slope, which may cause power to increase significantly due to power dissipation from momentary short circuits (e.g., crowbar currents). Moreover, adding a bit to the phase interpolator 62 approximately doubles both the size of the delay-locked loop 12. As such, it may be difficult to realize a phase interpolator 62 with a phase resolution greater than 5 bits.

Figure 4:
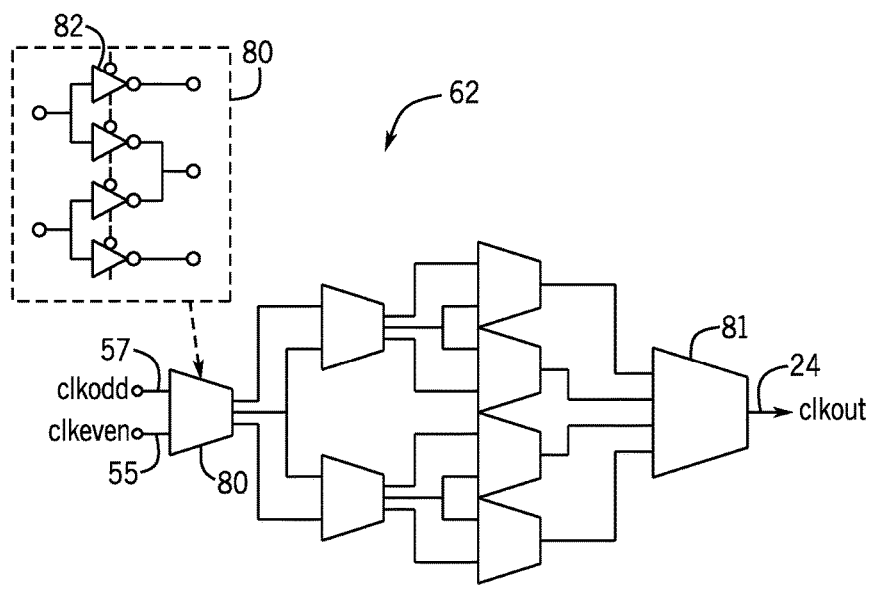
FIG. 4 is a schematic diagram of a phase interpolator of the delay-locked loop of FIG. 1 using interpolator cells connected in series, in accordance with an embodiment of the present disclosure.

In alternative embodiments, the set of interpolator cells 80 are connected in series. For example, FIG. 4 is a schematic diagram of the phase interpolator 62 using interpolator cells 80 connected in series, in accordance with an embodiment of the present disclosure. As illustrated, each interpolator cell 80 includes four CMOS inverters 82 that generate a middle phase between the even clock signal 55 and the odd clock signal 57. The number of bits (e.g., N) of the fine delay control signal 63 corresponds to the set of interpolator cells 80 in the fine delay block 42. Specifically, the number of interpolator cells 80 connected in series for N-bit phase resolution for is $2^{N-1}$. The number of bits may include any suitable number for providing the fine delay component, such as between 1 and 1024 bits. However, adding a bit to the phase interpolator 62 using interpolator cells 80 connected in series results in higher power consumed and longer propagation delay, which may negatively impact system timing. Moreover, adding a bit to the phase interpolator 62 approximately doubles both the size of the delay-locked loop 12. As such, it may be difficult to realize a phase interpolator 62 with a phase resolution greater than 5 bits. A selecting element, such as multiplexer 81 or a selector, may be used to select an output from the interpolator cells 80 to generate the output clock signal 24.

Figure 5:
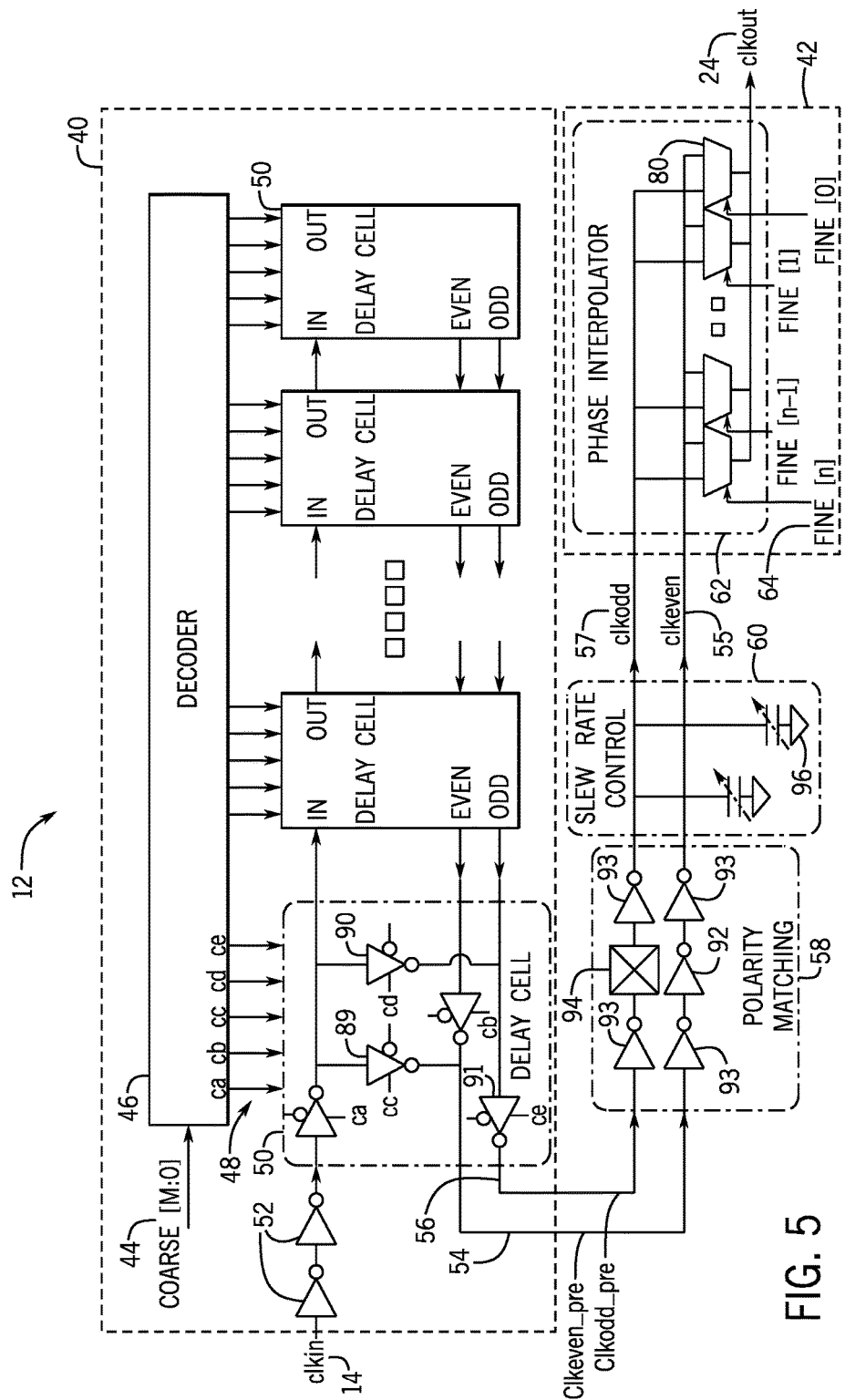
FIG. 5 is a more-detailed schematic diagram of the delay-locked loop of FIG. 1, in accordance with an embodiment of the present disclosure.

FIG. 5 is a more-detailed schematic diagram of the delay-locked loop 12 of FIG. 1, in accordance with an embodiment of the present disclosure. As illustrated, the decoder 46 decodes the coarse delay control signal 44 into a set of delay cell control signals 48 (e.g., ca, cb, cc, cd, ce) that are sent to a set of delay cells 50. Each delay cell 50 may include five tri-stated CMOS inverters 90. In other embodiments, each delay cell 50 may include more or less tri-stated CMOS inverters 90. Each delay cell 50 outputs two clock signals, an even clock signal (clkeven_pre) 54 and an odd clock signal (clkodd_pre) 56. One of the even clock signal 54 and the odd clock signal 56 passes through an additional CMOS inverter 90 in the delay cell 50. As such, one of the even clock signal 54 and the odd clock signal 56 is 180 degrees out of phase with the other (e.g., has opposite polarity) and is delayed by one inverter. For example, the odd clock signal 56 may pass through three CMOS inverters 90 of the delay cell 50 while the even signal 54 may pass through two CMOS inverters 90 of the delay cell 50. As a result, the odd clock signal 56 is 180 degrees out of phase with the even clock signal 54 and is delayed by one inverter. As illustrated, some CMOS inverters (e.g., 91) may be in a return path of the delay cells 50, while others (e.g., 89) may not. While FIGS. 5-10 show some CMOS inverters in the return path and others that are not, any suitable configuration of the CMOS inverters may be used that enable a delay of one inverter between the even clock signal 54 and the odd clock signal 56.

Additionally, as illustrated, the polarity matching block 58 includes three inverters (e.g., CMOS inverters) 92, 93 connected in series that are applied to the even clock signal 54. The polarity matching block also includes two inverters 93 connected in series with a component 94 that mimics delay of the inverter 92. The component 94 may be any suitable component that may mimic delay of the inverter 92, such as a transmission gate. As illustrated, the polarity matching block 58 inverts the even clock signal 54 using the three inverters 92, 93 connected in series, while the odd clock signal 56 is delayed by the same amount as the even clock signal 54 as a result of passing through the two inverters 93 connected in series with the component 94. As such, a resulting even clock signal 55 and a resulting odd clock signal 57 are output to have the same polarity, but the delay of one inverter still remains between the even clock signal 55 and the odd clock signal 57. In some embodiments, the additional inverters 93 are removed, such that the only inverter of the polarity matching block 58 is the inverter 92 (whose delay is matched by the component 94).

As illustrated, the slew rate control block 60 includes a slew rate control circuit 96 for each of the output signals (the polarity-matched even clock signal 55 and odd clock signal 57) from the polarity matching block 58. The slew rate control circuits 96 may slow down edges of the output signals of the polarity matching block 58 for better interpolation accuracy. As illustrated, the phase interpolator 62 is configured as shown in FIG. 3, such that the interpolator cells 80 are connected in parallel.

Table 1 below shows an example of coding for delay increments using a 4-bit coarse delay and 3-bit fine delay. The first column "Code" shows a reference code for a delay (e.g., as instructed by the controller 18). The second column "Coarse Delay Code" shows a 4-bit code or instruction sequence for the coarse delay increment using Gray code corresponding to the reference code. In some embodiments, the coarse delay code may be any suitable number of bits (e.g., 1-1024) and the encoding/decoding scheme may be any suitable encoding/decoding scheme. The third column "Fine Delay Code" shows an 8-bit code or instruction sequence for the fine delay increment using thermometer code corresponding to the reference code. In some embodiments, the fine delay code may be any suitable number of bits (e.g., 1-1024) and the encoding/decoding scheme may be any suitable encoding/decoding scheme. The fourth column "Total Delay" shows the total delay corresponding to the reference code. "INV" means a delay amount corresponding to an inverter (e.g., 90) and "PI" means a delay amount corresponding to a phase interpolator (e.g., 62). Each coarse delay increment is one inverter delay whereas each fine delay increment is one-eighth inverter delay. The fifth column "Delay Increase" shows the increase of delay corresponding to the reference code when compared to the immediately previous reference code.

TABLE 1

Coding for Delay Increment

| Code | Coarse Delay Code (Gray Code) C[3:0] | Fine Delay Code (Thermometer Code) F[7:0] | Total Delay | Delay Increase |
|---|---|---|---|---|
| c0_f0 | 0000 | 00000000 | 7 INV + PI | N/A |
| c0_f1 | 0000 | 00000001 | 7 INV + [1/8] * INV + PI | [1/8] * INV |
| c0_f2 | 0000 | 00000011 | 7 INV + [2/8] * INV + PI | [1/8] * INV |
| c0_f3 | 0000 | 00000111 | 7 INV + [3/8] * INV + PI | [1/8] * INV |
| c0_f4 | 0000 | 00001111 | 7 INV + [4/8] * INV + PI | [1/8] * INV |
| c0_f5 | 0000 | 00011111 | 7 INV + [5/8] * INV + PI | [1/8] * INV |
| c0_f6 | 0000 | 00111111 | 7 INV + [6/8] * INV + PI | [1/8] * INV |
| c0_f7 | 0000 | 01111111 | 7 INV + [7/8] * INV + PI | [1/8] * INV |
| c0_f8 | 0000 | 11111111 | 7 INV + [8/8] * INV + PI | [1/8] * INV |
| c1_f0 | 0001 | 11111111 | 8 INV + PI | 0 |
| c1_f1 | 0001 | 01111111 | 8 INV + [1/8] * INV + PI | [1/8] * INV |
| c1_f2 | 0001 | 00111111 | 8 INV + [2/8] * INV + PI | [1/8] * INV |
| c1_f3 | 0001 | 00011111 | 8 INV + [3/8] * INV + PI | [1/8] * INV |
| c1_f4 | 0001 | 00001111 | 8 INV + [4/8] * INV + PI | [1/8] * INV |
| c1_f5 | 0001 | 00001111 | 8 INV + [5/8] * INV + PI | [1/8] * INV |
| c1_f6 | 0001 | 00000111 | 8 INV + [6/8] * INV + PI | [1/8] * INV |
| c1_f7 | 0001 | 00000011 | 8 INV + [7/8] * INV + PI | [1/8] * INV |
| c1_f8 | 0001 | 00000001 | 8 INV + [8/8] * INV + PI | [1/8] * INV |
| c2_f0 | 0001 | 00000000 | 9 INV + PI | 0 |
| c2_f1 | 0011 | 00000000 | 9 INV + [1/8] * INV + PI | [1/8] * INV |

The total delays for c[n]_f8 and c[n+1]_f0 are similar. One of these delays may be skipped (e.g., by using a finite state machine programmed).

Figure 6:
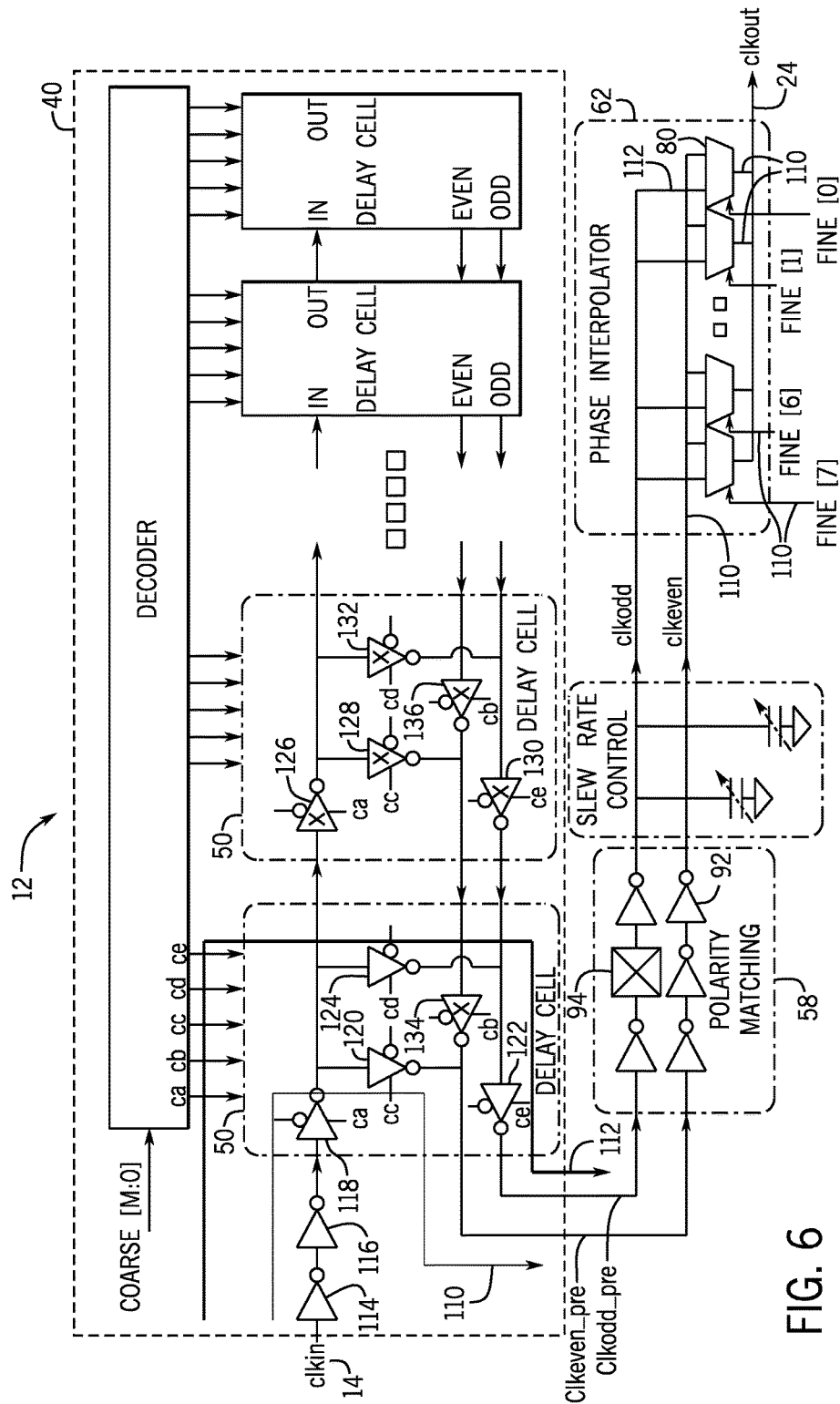
FIG. 6 shows the operation of the delay-locked loop of FIG. 1 using a first reference code, in accordance with an embodiment of the present disclosure.

As an example, FIG. 6 shows the operation of the delay-locked loop 12 of FIG. 1 that uses the coding shown in Table 1 using a first reference code of c0_f0, in accordance with an embodiment of the present disclosure. The input clock signal 14 follows an even clock path 110 and an odd clock path 112. The coarse delay applied to the even clock path 110 and the odd clock path 112 is based on the coarse delay code, 0000. The coarse delay applied to the even clock path 110 after passing through the delay cell 50 includes four inverters, 114, 116, 118, 120. The coarse delay applied to the odd clock path 112 after passing through the delay cell 50 includes five inverters, 114, 116, 118, 122, 124. The remaining inverters (e.g., 126, 128, 130, 132, 134, 136) of the coarse delay block 40 are tri-stated (as indicated by the "x" symbol) based on the coarse delay code and do not add delay to the even clock path 110 or the odd clock path 112.

After passing through the polarity matching block 58, the total coarse delay applied to the even clock path 110 is seven inverters (due to the additional three inverters 92, 93 of the polarity matching block 58). The total coarse delay applied to the odd clock path 112 is eight inverters (due to the additional two inverters 93 and the component 94 that mimics the delay of the inverter 92 of the polarity matching block 58).

Based on the fine delay code 00000000, each of the interpolator cells of the phase interpolator 62 selects the even clock path 110. As such, the total delay applied to the input clock signal 14 by the delay-locked loop 12 is seven inverters plus the delay from the phase interpolator 62.

Figure 7:
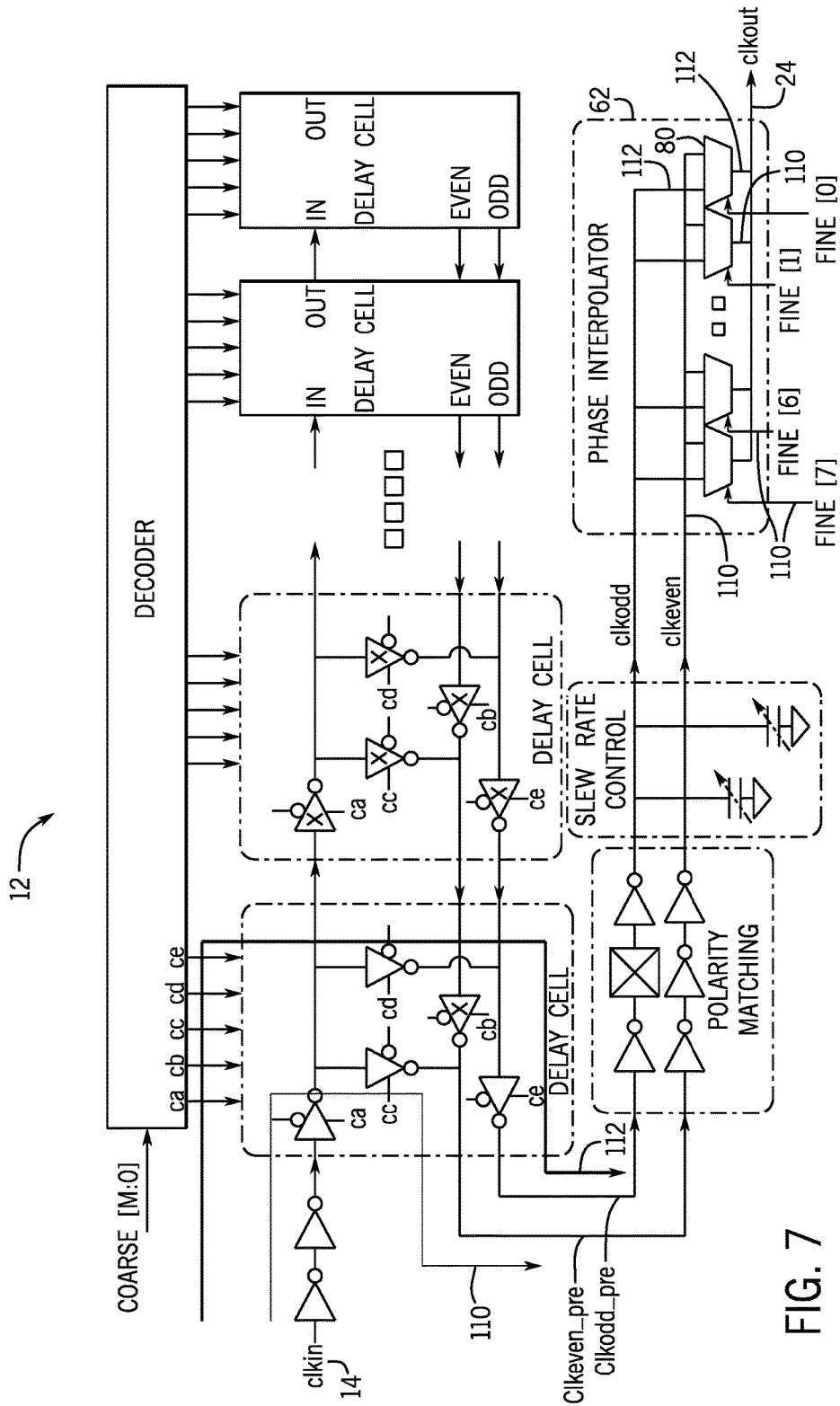
FIG. 7 shows the operation of the delay-locked loop of FIG. 1 using a second reference code, in accordance with an embodiment of the present disclosure.

As another example, FIG. 7 shows the operation of the delay-locked loop 12 of FIG. 1 that uses the coding shown in Table 1 using a second reference code of c0_f1, in accordance with an embodiment of the present disclosure. As with the previous example shown in FIG. 6, the coarse delay applied to the even clock path 110 and the odd clock path 112 is based on the coarse delay code, 0000. Thus, the total coarse delay applied to the even clock path 110 is seven inverters and the total coarse delay applied to the odd clock path 112 is eight inverters. Based on the fine delay code 00000001, each of the interpolator cells of the phase interpolator 62 selects the even clock path 110, except for the first interpolator cell (Fine[0]), which selects the odd clock path 112. Because the phase interpolator 62 has three binary/gray bits (equivalent to 8 Thermometer bits), the phase interpolator 62 includes eight interpolator cells 80, with each interpolator cell 80 capable of applying a delay of one-eighth of an inverter. Because one of the interpolator cells 80 selects the odd clock path 112 which is delayed by an inverter compared to the even clock path 110, the total delay applied to the input clock signal 14 by the delay-locked loop 12 is seven and one-eighth inverters plus the delay from the phase interpolator 62.

Figure 8:
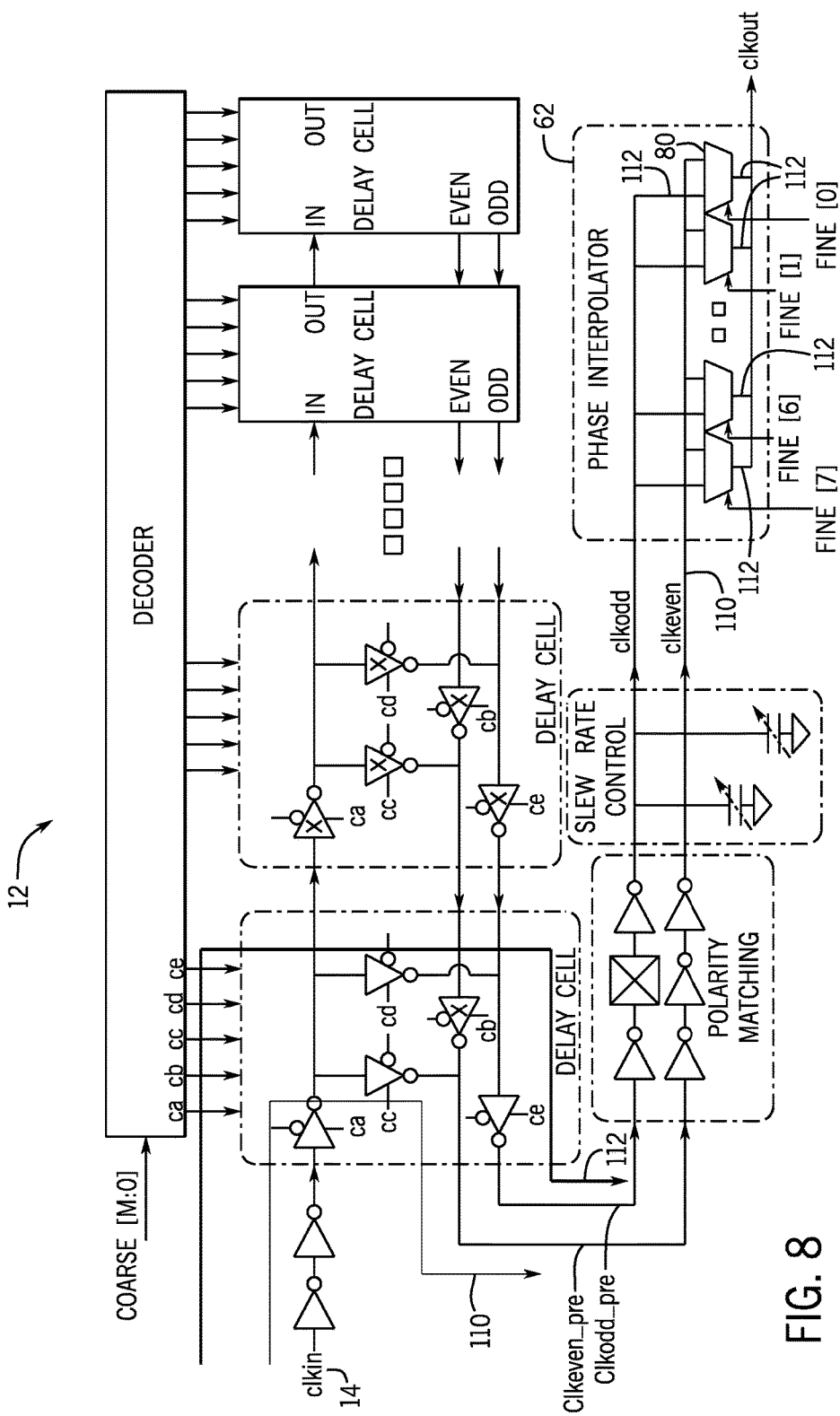
FIG. 8 shows the operation of the delay-locked loop of FIG. 1 using a third reference code, in accordance with an embodiment of the present disclosure.

As yet another example, FIG. 8 shows the operation of the delay-locked loop 12 of FIG. 1 that uses the coding shown in Table 1 using a third reference code of c0_f8, in accordance with an embodiment of the present disclosure. As with the previous examples shown in FIGS. 6 and 7, the coarse delay applied to the even clock path 110 and the odd clock path 112 is based on the coarse delay code, 0000. Thus, the total coarse delay applied to the even clock path 110 is seven inverters and the total coarse delay applied to the odd clock path 112 is eight inverters. Based on the fine delay code 11111111, each of the interpolator cells of the phase interpolator 62 selects the odd clock path 112. The total delay applied to the input clock signal 14 by the delay-locked loop 12 is eight inverters (i.e., seven and 8/8 inverters) plus the delay from the phase interpolator 62.

Figure 9:
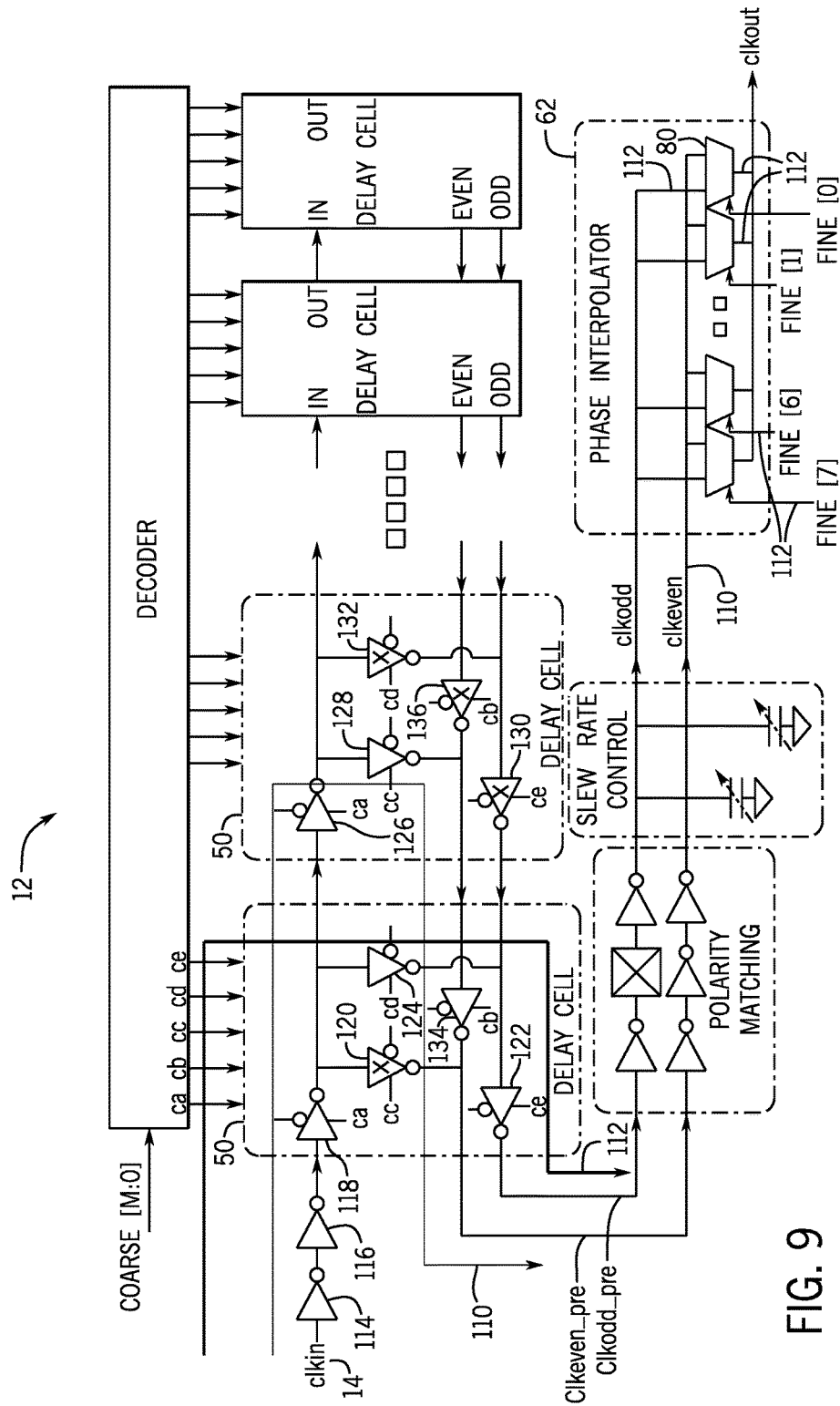
FIG. 9 shows the operation of the delay-locked loop of FIG. 1 using a fourth reference code, in accordance with an embodiment of the present disclosure.

As another example, FIG. 9 shows the operation of the delay-locked loop 12 of FIG. 1 that uses the coding shown in Table 1 using a fourth reference code of c1_f0, in accordance with an embodiment of the present disclosure. The coarse delay applied to the even clock path 110 and the odd clock path 112 is based on the coarse delay code, 0001. The coarse delay applied to the even clock path 110 after passing through the delay cells 50 includes six inverters, 114, 116, 118, 126, 128, 134. The coarse delay applied to the odd clock path 112 after passing through the delay cell 50 remains the same as shown in FIG. 6 (i.e., including the five inverters, 114, 116, 118, 124, 122). The remaining inverters (e.g., 120, 130, 132, 136) of the coarse delay block 40 are tri-stated (as indicated by the "x" symbol) based on the coarse delay code and do not add delay to the even clock path 110 or the odd clock path 112.

After passing through the polarity matching block 58, the total coarse delay applied to the even clock path 110 is nine inverters (due to the additional three inverters 92, 93 of the polarity matching block 58). The total coarse delay applied to the odd clock path 112 remains the same as shown in FIG. 6 (i.e., eight inverters). Thus, the total coarse delay applied to the even clock path 110 is nine inverters and the total coarse delay applied to the odd clock path 112 is eight inverters. Based on the fine delay code 11111111, each of the interpolator cells of the phase interpolator 62 selects the odd clock path 112. The total delay applied to the input clock signal 14 by the delay-locked loop 12 is eight inverters (i.e., seven and 8/8 inverters) plus the delay from the phase interpolator 62. As such, the total delays for c0_f8 and c1_f0 are both eight inverters plus the delay from the phase interpolator 62. One of these delays may be skipped (e.g., using a finite state machine programmed in, for example, the memory device(s) 28).

Figure 10:
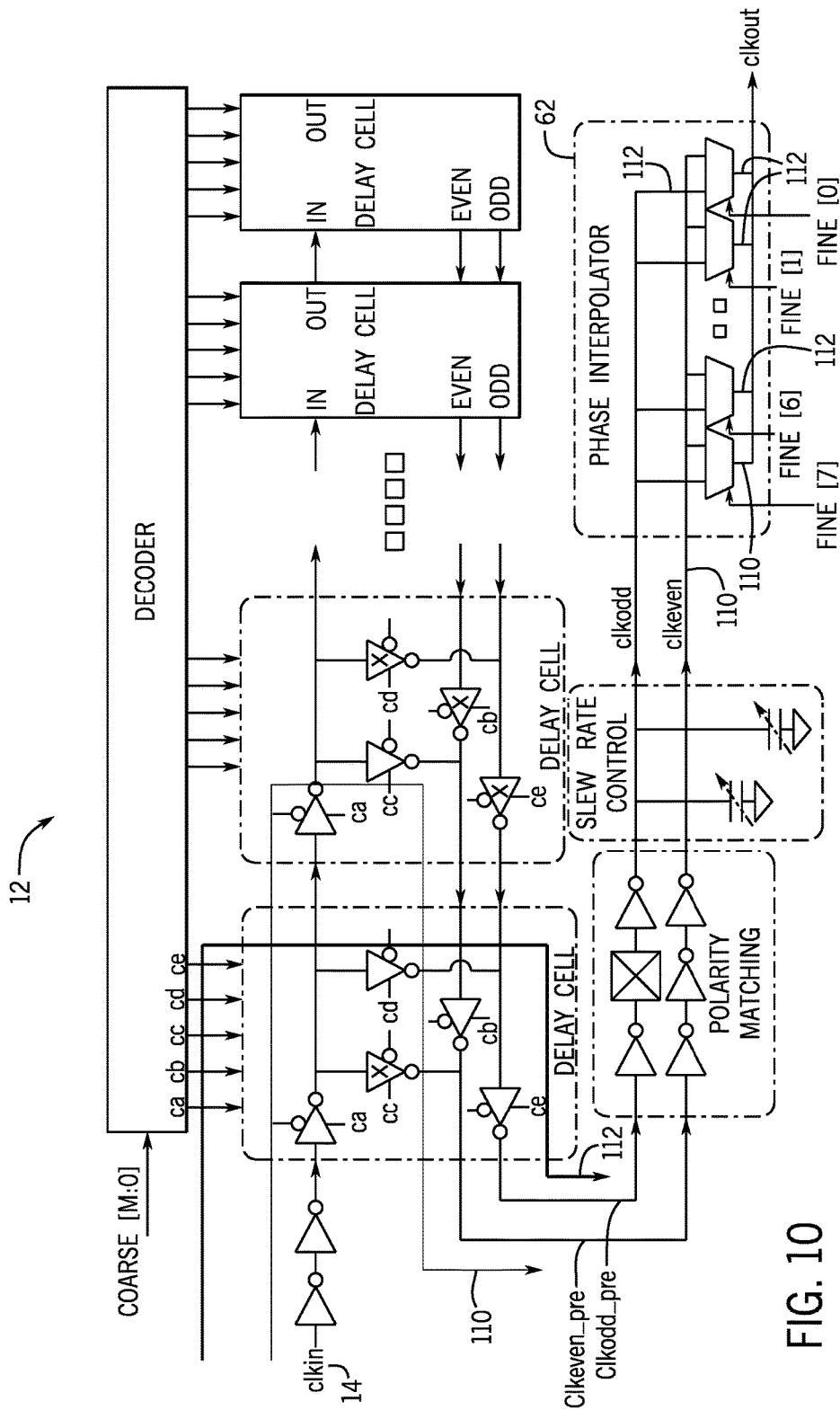
FIG. 10 shows the operation of the delay-locked loop of FIG. 1 using a fifth reference code, in accordance with an embodiment of the present disclosure.

As yet another example, FIG. 10 shows the operation of the delay-locked loop 12 of FIG. 1 that uses the coding shown in Table 1 using a fifth reference code of c1_f1, in accordance with an embodiment of the present disclosure. As with the previous example shown in FIG. 9, the coarse delay applied to the even clock path 110 and the odd clock path 112 is based on the coarse delay code, 0001. Thus, the total coarse delay applied to the even clock path 110 is nine inverters and the total coarse delay applied to the odd clock path 112 is eight inverters. Based on the fine delay code 011111111, each of the interpolator cells of the phase interpolator 62 selects the odd clock path 112, except for the last interpolator cell (Fine[7]), which selects the even clock path 110. The total delay applied to the input clock signal 14 by the delay-locked loop 12 is eight and one-eighth inverters plus the delay from the phase interpolator 62.

Figure 11:
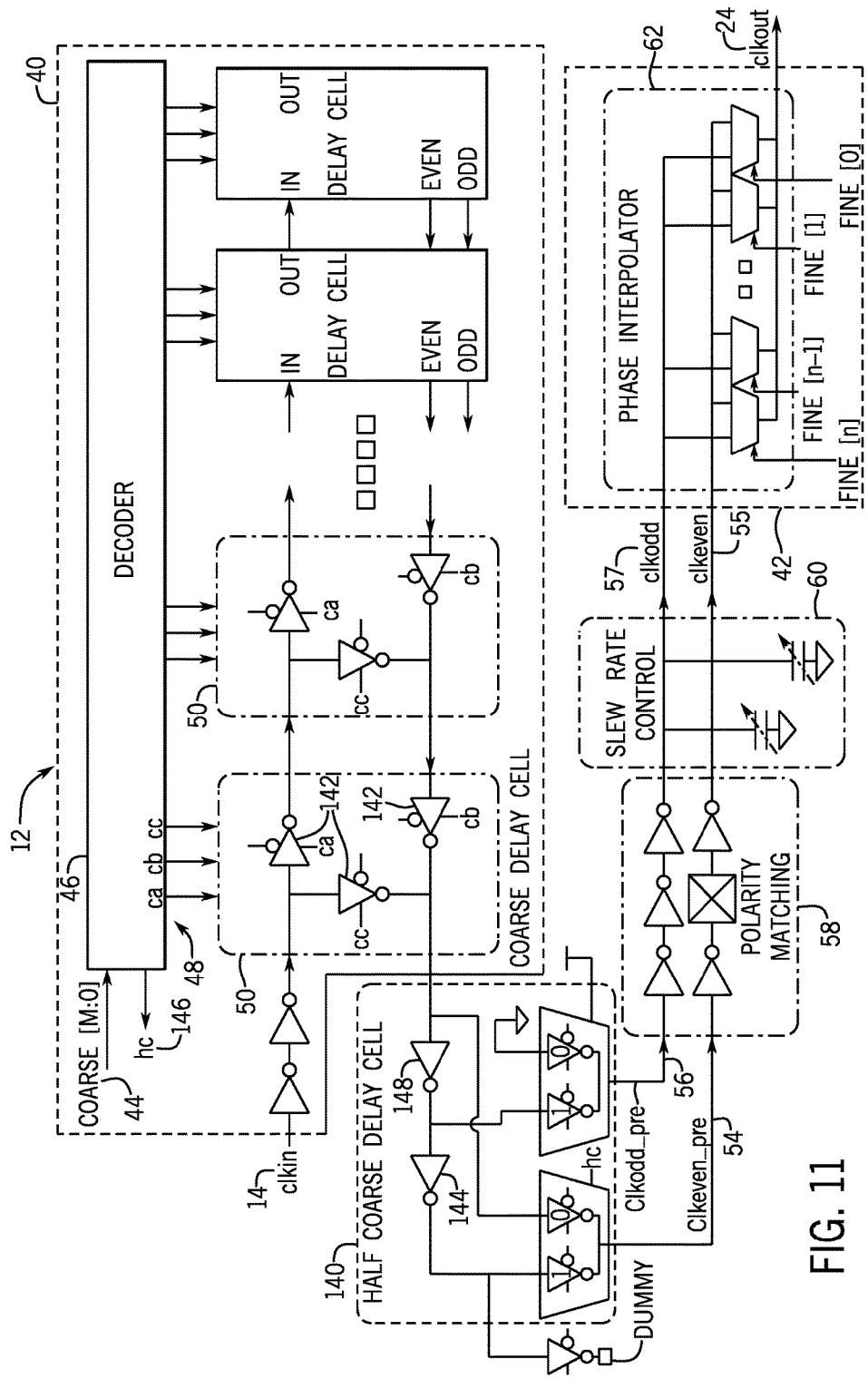
FIG. 11 is a schematic diagram of the delay-locked loop of FIG. 1 that includes a half coarse delay cell, in accordance with an embodiment of the present disclosure.

FIG. 11 is a schematic diagram of the delay-locked loop 12 of FIG. 1 that includes a half coarse delay cell 140, in accordance with an embodiment of the present disclosure. The delay-locked loop 12 includes a coarse delay block 40 (that may include N-bit coarse delay cells 50) and the 1-bit half-coarse delay cell 140. The coarse delay block 40 may increment delay by a delay amount corresponding to two inverters (e.g., 142) whereas the half-coarse delay cell 140 may increment delay by a delay amount correspond to one inverter (e.g., 144). The decoder 46 may decode the coarse delay control signal 44 into a set of delay cell control signals 48 (e.g., ca, cb, cc) that are sent to a set of delay cells 50 and a half coarse delay cell control signal 146 (e.g., hc). As illustrated, the half-coarse delay cell 140 includes two inverters (e.g., 144, 148) that may be used to increment a delay amount correspond to one inverter (e.g., 144). In other embodiments, the half-coarse delay cell 140 may include any suitable components (including more or less inverters) to increment the delay amount correspond to one inverter (e.g., 144).

The half-coarse delay cell 140 may generate the even clock signal (clkeven_pre) 54 and the odd clock signal (clkodd_pre) 56, which are 180 degrees out of phase with the other (e.g., of opposite polarity) and a delay amount corresponding to one inverter (e.g., 144) apart. The even clock signal (clkeven_pre) 54 and the odd clock signal (clkodd_pre) 56 are then input to the polarity matching block 58. The remaining portion of the delay-locked loop 12 may operate as illustrated in FIG. 5. The controller 18 and the delay-locked loop 12 of FIG. 11 may use any suitable encoding/decoding scheme, including that described in Table 1.

While the disclosed embodiments use the coding scheme of Table 1, and the coarse delay code uses the Gray coding scheme and the fine delay code uses the thermometer coding scheme, it should be understood that any suitable coding scheme may be used.

Figure 12:
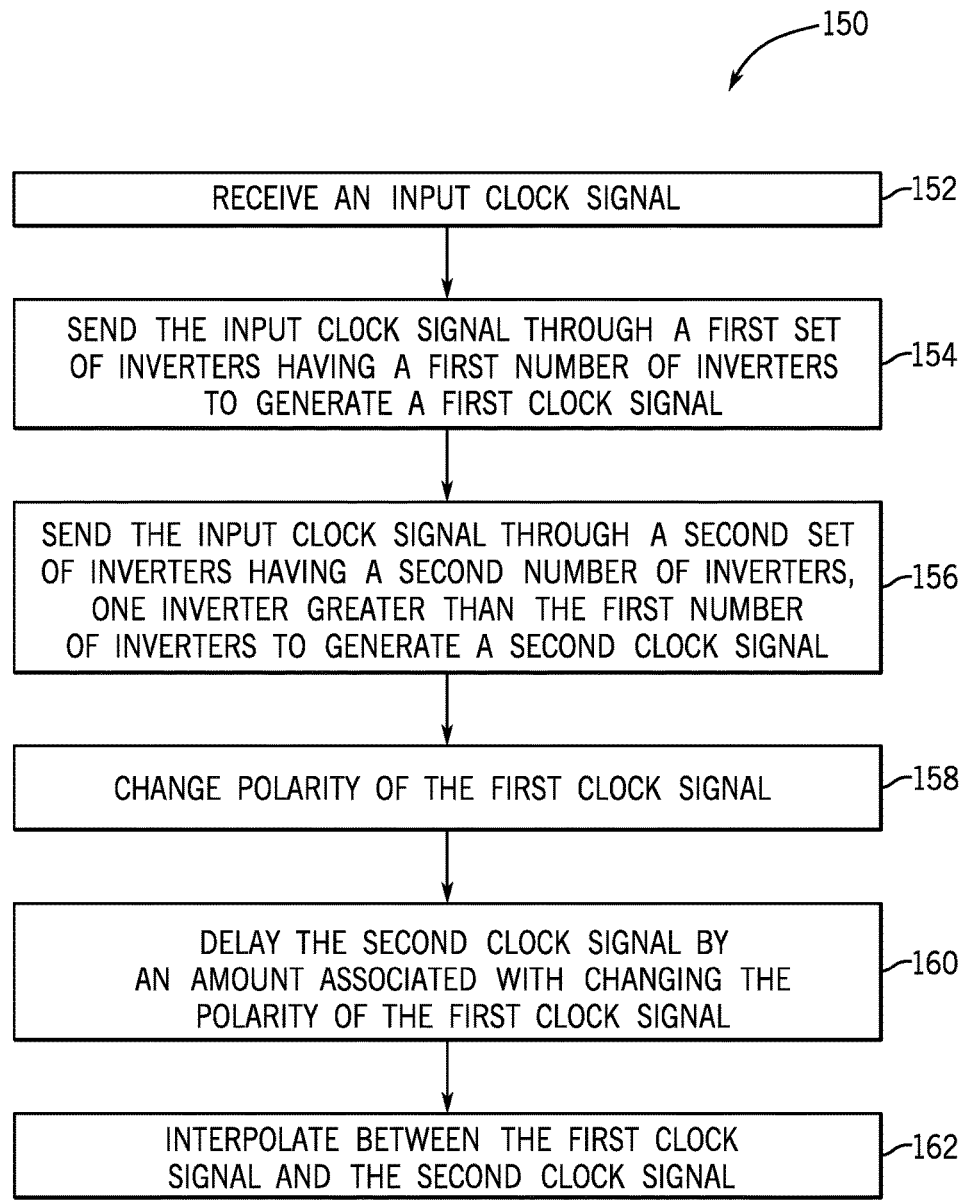
FIG. 12 is flowchart of a method for generating a delay using the delay-locked loop of FIG. 1 that includes a phase resolution of a single inverter, in accordance with an embodiment of the present disclosure.

FIG. 12 is flowchart of a method 150 for generating a delay using the delay-locked loop 12 of FIG. 1 that includes a phase resolution of a single inverter, in accordance with an embodiment of the present disclosure. The method 150 may be performed by any suitable device that may control the delay-locked loop 12, such as the controller 18. While the method 150 is described using steps in a specific sequence, it should be understood that the present disclosure contemplates that the describe steps may be performed in different sequences than the sequence illustrated, and certain described steps may be skipped or not performed altogether. In some embodiments, the method 150 may be implemented by executing instructions stored in a tangible, non-transitory, computer-readable medium, such as the memory device(s) 28, using a processor, such as the processor(s) 26. While the present disclosure discusses a control element in the form of the controller 18 having the processor(s) 26 and the memory device(s) 28, it should be understood that any suitable control element is also contemplated, such as an analog biasing circuit or finite state machine.

Referring now to the method 150, the controller 18 may receive (block 152) the input clock signal 14. The controller 18 may then send (block 154) the input clock signal 14 through a first set of inverters having a first number of inverters to generate a first clock signal by instructing the delay-locked loop 12. Specifically, the controller 18 may use a coarse delay code to select the first set of inverters having the first number of inverters to generate the first clock signal (e.g., the even clock path 110).

The controller 18 may send (block 156) the input clock signal 14 through a second set of inverters having a second number of inverters one inverter greater than (or less than) the first number of inverters to generate a second clock signal by instructing the delay-locked loop 12. The controller 18 may use the coarse delay code to select the second set of inverters having the second number of inverters to generate the second clock signal (e.g., the odd clock path 112).

The controller 18 may then change (block 158) polarity of the first clock signal by instructing the polarity matching block 58. Specifically, the controller 18 may pass the first clock signal through an inverter to change its polarity. In some embodiments, the controller 18 may change polarity of the second clock signal rather than the first clock signal.

The controller 18 may delay (block 160) the second clock signal by an amount associated with changing (in block 158) the polarity of the first clock signal. Specifically, the controller 18 may pass the second clock signal through a component that mimics the delay of the inverter, such as a transmission gate. In this manner, the first clock signal and the second clock signal are output to have the same polarity, but the delay of one inverter still remains between the even clock signal 55 and the odd clock signal 57. In some embodiments, the controller 18 may delay the first clock signal rather than the second clock signal, such as when the controller 18 changed the polarity (in block 158) of the second clock signal rather than the first clock signal.

The controller 18 may then interpolate (block 162) between the first clock signal and the second clock signal to achieve greater phase resolution by using the phase interpolator 62. Specifically, the controller 18 may use a fine delay code to enable target the interpolator cells 80 of the interpolator 62 to interpolate between the first clock signal and the second clock signal.

As described above, the disclosed embodiments include a delay chain (e.g., a delay-locked loop) that generates a delay that includes a phase resolution of a single inverter (prior to interpolation). The delay chain also includes a polarity matching component to compensate for polarity reversal of a clock signal passing through the single inverter. The disclosed embodiments enable reducing power consumption and size of the delay chain loop by half, while retaining the same phase resolution. The disclosed embodiments also enable shorter propagation delay from input to output of the delay chain. Moreover, the disclose embodiments enable increased phase resolution (e.g., by adding a bit to the phase interpolator) while retaining the same size of delay chain, scaling well with faster devices.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A delay-locked loop comprising:
a plurality of inverters coupled together, wherein the plurality of inverters receives an input clock signal and outputs a first clock signal and a second clock signal, wherein:
the input clock signal passes through a first set of inverters of the plurality of inverters having a first number of inverters to generate the first clock signal; and
the input clock signal passes through a second set of inverters of the plurality of inverters having a second number of inverters one inverter greater than the first number of inverters to generate the second clock signal;
a polarity matching block that receives the first clock signal and the second clock signal and changes polarity of one of the first clock signal and the second clock signal; and
a slew rate control block that increases interpolation accuracy of the first clock signal and the second clock signal.

2. The delay-locked loop of claim 1, comprising a decoder that decodes a coarse delay code that enables the first set of inverters and the second set of inverters.

3. The delay-locked loop of claim 1, wherein the polarity matching block comprises an inverter and a component that mimics delay of the inverter.

4. The delay-locked loop of claim 3, wherein the component comprises a transmission gate.

5. The delay-locked loop of claim 1, comprising a phase interpolator that interpolates between the first clock signal and the second clock signal.

6. The delay-locked loop of claim 5, wherein the phase interpolator comprises a plurality of interpolator cells each comprising a respective plurality of the inverters.

7. The delay-locked loop of claim 6, wherein the phase interpolator decodes a fine delay code that enables one or more interpolator cells of the plurality of interpolator cells.

8. An integrated circuit comprising:
a delay chain that delays an input clock signal, comprising:
a plurality of inverters coupled together that receives the input clock signal and outputs a first clock signal and a second clock signal, wherein:
the input clock signal passes through a first set of inverters of the plurality of inverters having a first number of inverters to generate the first clock signal; and
the input clock signal passes through a second set of inverters of the plurality of inverters having a second number of inverters one inverter greater than the first number of inverters to generate the second clock signal; and
a polarity matching block that receives the first clock signal and the second clock signal and changes polarity of one of the first clock signal and the second clock signal; and
a controller communicatively coupled to the delay chain that:
receives the input clock signal and a feedback clock signal from a clock distribution network; and
instructs the delay chain to delay the input clock signal such that a first phase of the input clock signal approximately matches a second phase of the feedback clock signal at least in part by sending an instruction sequence of bits to the delay chain, wherein the instruction sequence of bits comprises a coarse delay code and a fine delay code.

9. The integrated circuit of claim 8, wherein the delay chain comprises a decoder communicatively coupled to the plurality of inverters that decodes the coarse delay code.

10. The integrated circuit of claim 9, wherein the delay chain enables the first set of inverters and the second set of inverters based on the coarse delay code.

11. The integrated circuit of claim 8, wherein the delay chain comprises a phase interpolator that interpolates between the first clock signal and the second clock signal, wherein the phase interpolator comprises a plurality of interpolator cells each comprising a respective plurality of inverters.

12. The integrated circuit of claim 11, wherein the phase interpolator decodes the fine delay code and enables one or more interpolator cells of the plurality of interpolator cells.

13. The integrated circuit of claim 11, wherein the phase interpolator interpolates between the first clock signal and the second clock signal after the polarity matching block changes polarity of the one of the first clock signal and the second clock signal.

14. The integrated circuit of claim 11, wherein the plurality of interpolator cells are connected in parallel.

15. The integrated circuit of claim 11, wherein the plurality of interpolator cells are connected in series.

16. The integrated circuit of claim 8, wherein the delay chain comprises slew rate control circuits that increase interpolation accuracy of the first clock signal and the second clock signal.

17. A method for delay an input clock signal, comprising:
receiving the input clock signal;
instructing a delay chain to send the input clock signal through a first set of inverters of the delay chain having a first number of inverters to generate a first clock signal;
instructing the delay chain to send the input clock signal through a second set of inverters of the delay chain having a second number of inverters one inverter greater than the first number of inverters to generate a second clock signal;
instructing a polarity matching block to change polarity of the first clock signal or the second clock signal; and
instructing a phase interpolator to interpolate between the first clock signal and the second clock signal; and
instructing a slew rate control block to increase interpolation accuracy of the first clock signal and the second clock signal.

18. The method of claim 17, wherein instructing the phase interpolator to interpolate between the first clock signal and the second clock signal occurs after instructing the delay chain to send the input clock signal through the first set of inverters and instructing the delay chain to send the input clock signal through the second set of inverters.

* * * * *